United States Patent [19]
Morishita et al.

[11] Patent Number: 5,640,024
[45] Date of Patent: Jun. 17, 1997

[54] COMPRESSION-TYPE POWER SEMICONDUCTOR DEVICE

[75] Inventors: Kazuhiro Morishita; Kazuhisa Ide; Futoshi Tokunoh, all of Fukuoka, Japan

[73] Assignee: Mitsubishi Denki Kabushiki Kaisha, Tokyo, Japan

[21] Appl. No.: 569,902

[22] Filed: Dec. 8, 1995

[30] Foreign Application Priority Data

Jun. 29, 1995 [JP] Japan ..................... 7-163581

[51] Int. Cl.$^6$ ..................... H01L 29/74; H01L 29/04
[52] U.S. Cl. ..................... 257/147; 257/628
[58] Field of Search ..................... 257/147, 628

[56] References Cited

U.S. PATENT DOCUMENTS 3,899,363  8/1975  Dennard et al. ..................... 257/398

FOREIGN PATENT DOCUMENTS 2-248047  10/1990  Japan.
3-161952  7/1991  Japan.

*Primary Examiner*—Wael Fahmy
*Assistant Examiner*—Fetsum Abraham
*Attorney, Agent, or Firm*—Oblon, Spivak, McClelland, Maier & Neustadt, P.C.

[57] ABSTRACT

A compression-type semiconductor device comprises a silicon substrate in which crystal orientation between main faces opposite to each other is not larger than <1,0,0> ±27.5°; cathode and gate electrodes formed on one of the main faces of the silicon substrate; an anode electrode formed on the other of the main faces of the silicon substrate; a cathode thermal compensation plate for the cathode and gate electrodes; and an anode thermal compensation plate for the anode electrode.

9 Claims, 3 Drawing Sheets

THE INTERVAL CRYSTAL DEFECTS OF THE SILICON SUBSTRATE HAVING CRYSTAL ORIENTATION <1,0,0> OF THE COMPANY A

THE INTERVAL CRYSTAL DEFECTS OF THE SILICON SUBSTRATE HAVING CRYSTAL ORIENTATION <1,1,1> OF THE COMPANY A

COMPRESSION-TYPE POWER SEMICONDUCTOR DEVICE

BACKGROUND OF THE INVENTION

The present invention generally relates to a compression-type power semiconductor device, and particularly relates to a high blocking voltage bipolar power semiconductor device.

FIG. 5 is a sectional view showing a conventional alloy-type gate turn-off thyristor (hereinafter abbreviated to a "GTO") of 5 KV or more, which is disclosed in Japanese Patent Unexamined Publication Nos. Hei-2-248047 and Hei-3-161952. In the drawing, the reference numeral 1 designates an N$^-$ silicon substrate of plane orientation <1,1,1>; 2, a PB layer formed by diffusion of boron by ion-implantation into a front surface of the N$^-$ silicon substrate 1; 3, an NE layer formed by thermal diffusion of phosphorus into the PB layer 2; 4, a PE layer formed by selective ion-implantation of boron into a rear surface of the N$^-$ silicon substrate 1; 5, an N$^{++}$ layer formed by thermal diffusion of phosphorus into the outer side of the PE layer; 6, a passivation film of SiO$_2$; 7, an anode electrode; 8, a cathode electrode; 9, a gate electrode; 10, a silicon end surface; 11, passivation rubber made form silicon rubber; and 12 and 13, anode and cathode thermal compensation plates made from molybdenum respectively. The foregoing members constitute a high blocking voltage bipolar semiconductor device.

Description will be made as to a producing method of the foregoing conventional alloy-type GTO. First, boron is ion-implanted into a front surface (cathode side) of the N$^-$ silicon substrate 1 of plane orientation <1,1,1> having a resistivity of 300~400 Ω.cm and a thickness of 700 μm or more, and then drive-in diffused by heat treatment at 1250° C. for about 170 hours, resulting in formation of the PB layer 2 having a surface boron concentration of $10^{17} \sim 10^{18}$ atoms/cm$^2$ in the depth of 80~90 μm.

Next, phosphorous is deposited onto the PB layer 2 and heat-treated at 1250° C. for about 8 hours so as to be drive-in diffused, resulting in formation of the NE layer 3 having a surface phosphorous concentration of $10^{19} \sim 10^{20}$ atoms/cm$^2$ in the depth of 20~25 μm.

Next, boron is selectively ion-implanted onto a rear surface (anode side) of the N$^-$ silicon substrate and heat-treated at 1250° C. for about 2 hours so as to be drive-in diffused, resulting in formation of the PE layer 4 having a surface boron concentration of $10^{18} \sim 10^{19}$ atoms/cm$^2$ in the depth of 10~12 μm.

Next, phosphorous is selectively deposited onto the anode side and heat-treated at 1250° C. for about 1 hour so as to be drive-in diffused, resulting in formation of the N$^{++}$ layer 5 having a surface phosphorous concentration of $10^{19} \sim 10^{20}$ atoms/cm$^2$ in the depth of 5~10 μm.

Next, aluminum is evaporated onto the anode side to thereby form the anode electrode 7, and aluminum is evaporated onto the surface of the anode thermal compensation plate 12. Then, the aluminum-evaporated surface of the anode thermal compensation plate 12 and the anode electrode 7 are heated so that they are made of the alloy-type. Further, after the cathode and gate electrodes 8 and 9 each having a thickness of about 10 μm are formed on the cathode side by aluminum evaporation, sputtering, or the like, they are heat-treated at 400°~500° C. for 30~60 minutes so as to improve the ohmic contact.

There is provided a stage portion of about 30 μm between the cathode and gate electrodes 8 and 9, and the junction portion at the stage portion between the NE and PB layers 3 and 2 is covered with the passivation film 6 such as an SiO$_2$ film, or the like, so as to be protected from contamination of sodium, or the like. Further, the end surface of the silicon substrate 1 is shaped into a positive bevel so as to relieve the electric field intensity, the silicon end surface 10 is covered with the passivation rubber 11 of silicon rubber, and the cathode thermal compensation plate 13 is pressed against the silicon substrate 1 on its cathode side to thereby complete the GTO of FIG. 5.

As described above, in the conventional GTO, the silicon substrate 1 of crystal orientation <1,1,1> was used. The reason why the silicon substrate 1 of crystal orientation <1,1,1> is used is that the mechanical strength thereof is large against stress such as thermal strain, or the like, generated in formation of an alloy-type junction so that crack is hardly generated in the producing process.

In the compression-type semiconductor device having such a conventional configuration, however, there has been a problem that a leak current upon voltage application increases to reduce the blocking voltage yield.

Further, a long time is required for heat treatment for drive-in diffusion, and, therefore, shortening of the production term as well as reduction of the cost have been required.

SUMMARY OF THE INVENTION

The present invention has been accomplished to solve such problems as described above to thereby reduce a leak current upon voltage application to improve the blocking voltage yield of compression-type semiconductor devices, and to thereby realize shortening of the production term and reduction of the cost.

The invention according to aspect 1 is a compression-type semiconductor device which comprises: a silicon substrate in which crystal orientation of main faces opposite to each other is within <1,0,0> ±27.5°; cathode and gate electrodes formed on one of the main faces of the silicon substrate; an anode electrode formed on the other of the main faces of the silicon substrate; a cathode thermal compensation plate for the cathode and gate electrodes; and an anode thermal compensation plate for the anode electrode.

The invention according to aspect 2 is a compression-type semiconductor device defined in aspect 1, wherein the silicon substrate has a resistivity not smaller than 300 Ω.cm and has a bipolar region constituted by an impurity-doped base layer and a non-doped region.

The invention according to aspect 3 is a compression-type semiconductor device defined in aspect 2, wherein the base layer is formed by thermal diffusion of an impurity.

The invention according to aspect 4 is a compression-type semiconductor device defined in aspect 1 or 2, wherein the silicon substrate is projected outside by 2 mm or more from a diameter of the cathode thermal compensation plate and/or the anode thermal compensation plate.

The invention according to aspect 5 is a compression-type semiconductor device defined in aspect 1 or 2, wherein each of junctions between the cathode thermal compensation plate and the cathode electrode and between the anode thermal compensation plate and the anode electrode is made of a without alloying-type.

According to the invention defined in aspects 1 and 2, the silicon substrate of crystal orientation <1,0,0> has less internal crystal faults so that a leak current upon high-voltage application is lowered remarkable to thereby improve the blocking voltage yield greatly.

According to the invention defined in aspect 3, the time for heat treatment is shortened so that not only the term for production is shortened and the cost is reduced, but also heavy metal contamination resulting from heat treatment jigs is reduced to suppress generation of internal crystal faults of silicon substrates due to the heavy metal contaminations to reduce a leak current upon high-voltage application to thereby further improve the blocking voltage yield.

According to the invention defined in aspect 4, a leak current hardly changes even if the quantity of projection is made to be not smaller than 2 mm in the silicon substrate of crystal orientation <1,0,0>. Therefore, the quantity of projection can be made to be 2 mm or more so that it is possible to advantageously cope with the scattering of the relative position between the silicon substrate and the thermal compensation plates in the producing process, and the yield can be improved.

According to the invention defined in aspect 5, each of the junctions between the cathode thermal compensation plate and the cathode electrode and between the anode thermal compensation plate and the anode electrode is made from a non-alloy material. Generation of thermal strain is therefore suppressed and the internal crystal fault of the silicon substrate due to the thermal strain is prevented from increasing so that the leak current is reduced upon high-voltage application and the blocking voltage yield is further improved.

DETAILED DESCRIPTION OF THE PREFERRED EMBODIMENTS

Description will be made below as to an embodiment of the present invention by using a GTO having a blocking voltage not lower than 4.5 KV.

Figure 1:
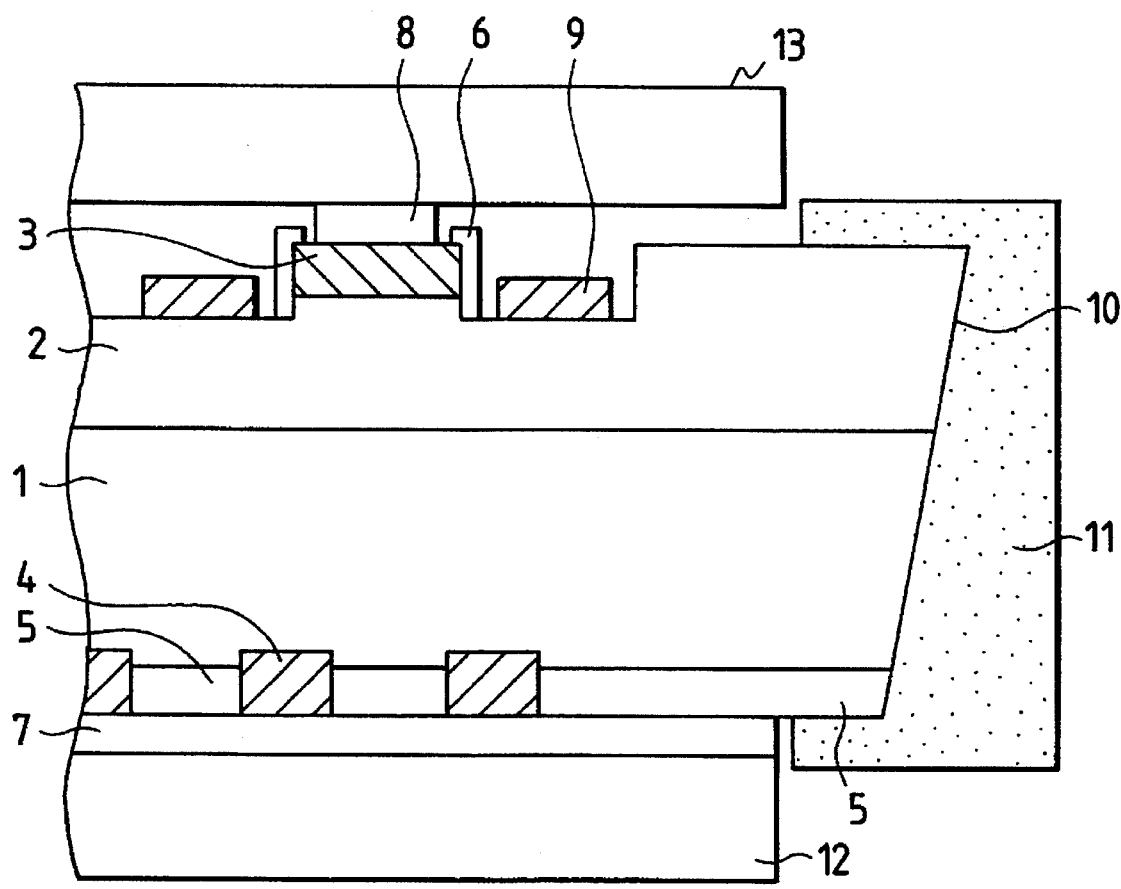
FIG. 1 is a sectional view showing an embodiment of the present invention.

FIG. 1 is a sectional view showing an embodiment of the compression-type semiconductor device according to the present invention. In the drawing, the reference numeral 14 designates an N⁻ silicon substrate in which crystal orientation between main faces is <1,0,0> ±2°; 2, a PB (P-type base) layer formed by diffusion of boron by ion-implantation into a front surface of the N⁻ silicon substrate 1; 3, an NE layer formed by thermal diffusion of phosphorus into the PB layer 2; 4, a PE layer formed by selective ion-implantation of boron into a rear surface of the N⁻silicon substrate 1; 5, an N⁺⁺ layer formed by thermal diffusion phosphorous into the outside of the PE layer 4; 6, a passivation film of $SiO_2$; 7, an anode electrode; 8, a cathode electrode; 9, a gate electrode; 10, a silicon end surface; 11, passivation rubber made from silicon rubber; and 12 and 13, anode and cathode thermal compensation plates made from molybdenum. The anode compensation plate 12 is pressed against the anode electrode 7 so as to form a non-alloy type.

Description will be made as to a producing method of the foregoing without alloying- and compression-type semiconductor device according to the present invention. First, boron is ion-implanted into a front surface (cathode side) of the N⁻ silicon substrate 14 of plane orientation <1,0,0>±2° having a resistivity of 300~400 Ω.cm and a thickness of 700 μm or less and then drive-in diffused by heat treatment at 1250° C. for about 120 hours, resulting in formation of the PB layer 2 having a surface boron concentration of $10^{17}$~10atoms/cm² in the depth of 80~90 μm. The rate of impurity diffusion in the silicon substrate 14 of crystal orientation <1,0,0> is higher than that in the silicon substrate of crystal orientation <1,1,1> so that the heat treatment time can be shortened.

Next, phosphorous is deposited onto the PB layer 2 and heat-treatment at 1250° C. for about 7 hours so as to be drive-in diffused, resulting in formation of the NE layer 3 having a surface phosphorous concentration of $10^{19}$~$10^{20}$ atoms/cm² in the depth of 20~25 μm.

Next, boron is selectively ion-implanted into a rear surface (anode side) of the N⁻ silicon substrate 14 and heat-treated at 1250° C. for about 2 hours so as to be drive-in diffused, resulting in formation of the PE layer 4 having a surface boron concentration of $10^{18}$ 18 $10^{19}$ atoms/cm² in the depth of 10~12 μm.

Next, phosphorous is selectively deposited onto the anode side and heat-treated at 1250° C. for about 1 hour so as to be drive-in diffused, resulting in formation of the N⁺⁺ layer 5 having a surface phosphorous concentration of $10^{19}$~$10^{20}$ atoms/cm² in the depth of 5~10 μm.

Next, aluminum is evaporated onto the anode side to thereby form the anode electrode 7. After the cathode and gate electrodes 8 and 9 each having a thickness of about 10 μm are formed on the cathode side by aluminum evaporation, sputtering, or the like, they are heat-treated at 400°~500° C. for 30~60 minutes so as to improve the ohmic contact.

There is provided a stage portion of about 30 μm between the cathode and gate electrodes 8 and 9, and the junction portion at the stage portion between the NE and PB layers 3 and 2 is covered with the passivation film 6 such as an $SiO_2$ film, or the like, so as to be protected from contamination of sodium, or the like. Further, the end surface of the silicon substrate 14 is processed into a positive bevel so as to relieve the electric field intensity, the silicon end surface 10 is covered with the passivation rubber 11 of silicon rubber, and the anode and cathode thermal compensation plates 12 and 13 are pressed against the silicon substrate 13 on the anode and cathode sides respectively to thereby complete the GTO of FIG. 1.

Figure 2:
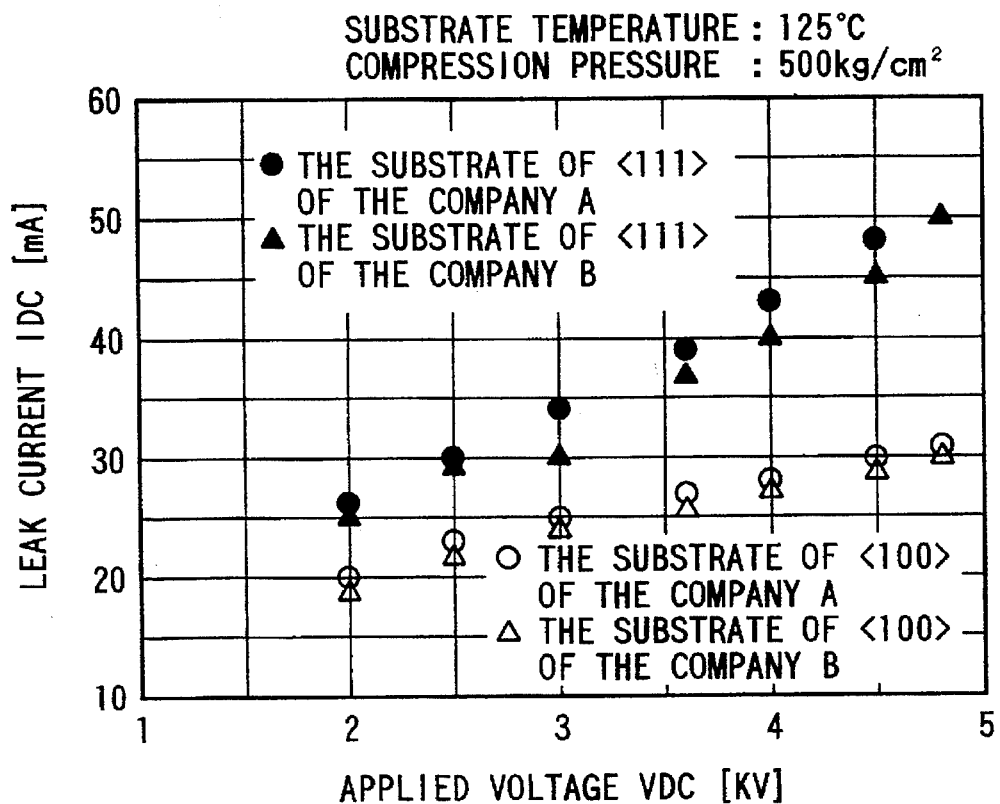
FIG. 2 is a view showing the relationship between an applied voltage and a leak current in comparison between the compression-type semiconductor device according to the present invention and the conventional compression-type semiconductor device.

FIG. 2 is a view showing the relationship between an applied voltage and a leak current in comparison between the compression-type semiconductor device of the configuration according to the present invention and the compression-type semiconductor device of the conventional configuration. Silicon substrates having crystal orientation <1,1,1> and <1,0,0> and produced by the companies A and B were used, and alloy- and without alloying-type devices were produced by using the silicon substrates having crystal orientation <1,1,1> and <1,0,0>, respectively.

As apparent from FIG. 2, the leak current in the without alloying- and compression-type semiconductor device using a silicon substrate of crystal orientation <1,0,0> decreases in comparison with the leak current in the alloy- and compression-type semiconductor device using a silicon substrate of crystal orientation <1,1,1>, and the decrease of the leak current is remarkable, particularly, in the case of high voltage application. As a result, blocking voltage yields were as follows. That is, in the case where the device was of the without alloying-type and the substrate had crystal orientation <1,0,0>, the yields were 90% and 92% according to the products by companies A and B, respectively, while in the case where the device was of the alloy-type and the substrate had the crystal orientation <1,1,1>, the yields were 63% and 78% according to products by the companies A and B, respectively. It was found that the blocking voltage yield was greatly improved in the former case. The yield could be recognized with good reproducibility and in the case where the device was of the alloy-type and the substrate had crystal orientation <1,0,0>, a leak current could be made smaller than that in the case of the crystal orientation <1,1,1>, while it increased slightly in comparison with the case of the without alloying-type.

Figure 3A:
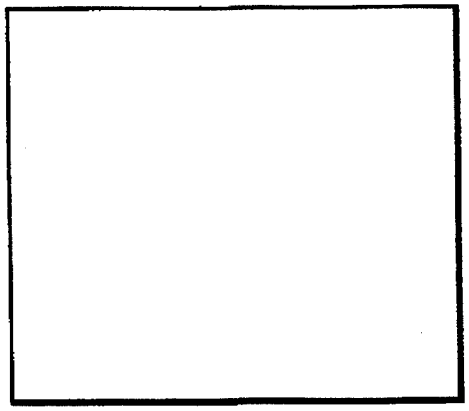
FIGS. 3A and 3B are diagrams showing crystal defects of silicon substrates having different crystal orientation from each other.
Figure 3B:
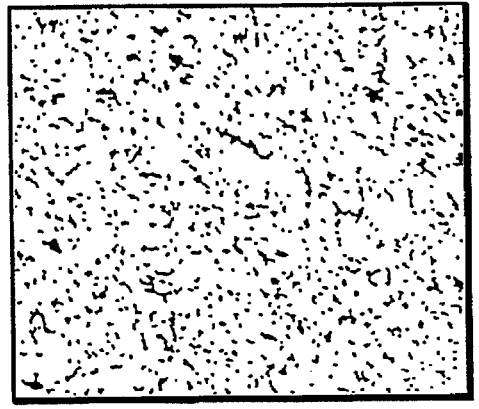

It is considered that the reason why the leak current decreases as described above is that the internal crystal defects of the silicon substrate ((a)) having crystal orientation <1,0,0> are less than that of the silicon substrate ((b)) having crystal orientation <1,1,1> as shown in the type views of FIG. 3 showing crystal defects of silicon substrates having crystal orientations different from each other. Further, this is considered because the junction is made to be of the without alloying-type, no thermal strain due to heat treatment is generated, no internal defects of the silicon substrate increases and the time for heat treatment is shortened so that heavy metal contamination resulting from heat treatment jigs is reduced and therefore the generation of internal crystal defects of the silicon substrate due to the heavy metal contamination is suppressed.

Figure 4:
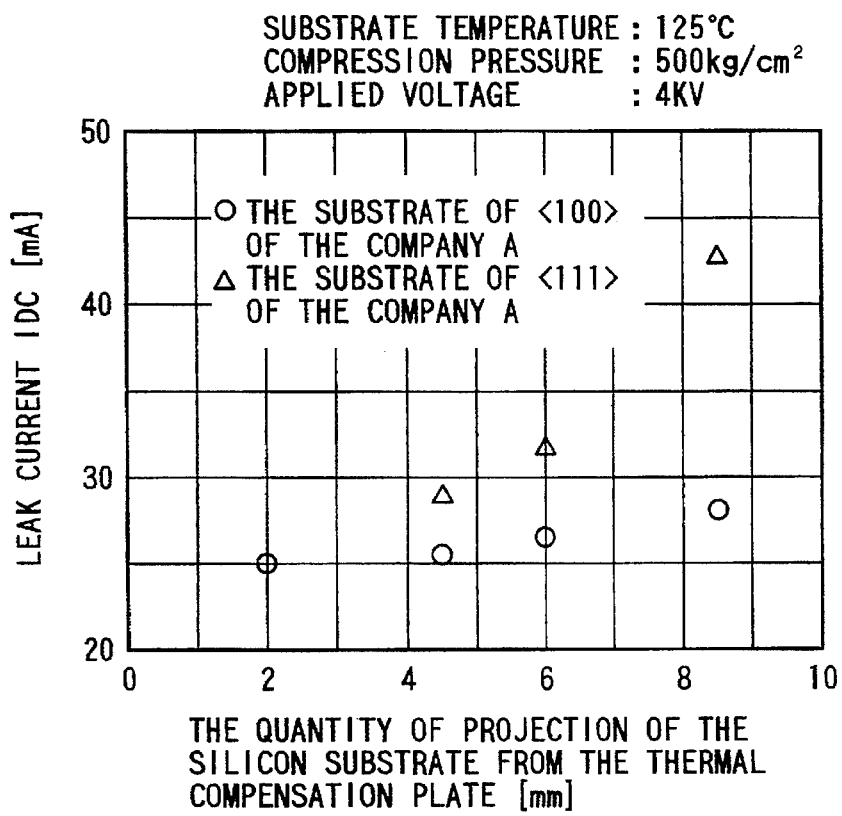
FIG. 4 is a view showing the relationship between the quantity of silicon substrate projected from the thermal compensation plates, and the leak current.
Figure 5:
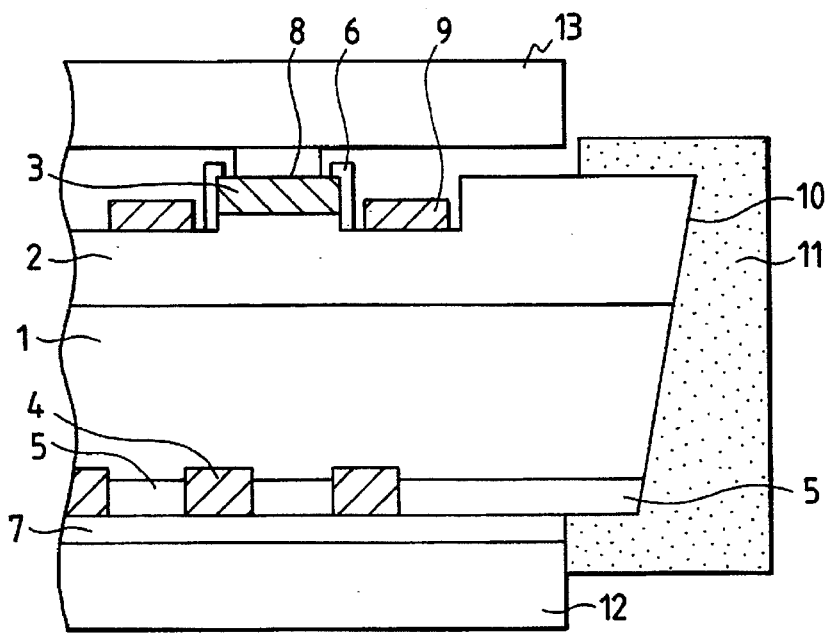
FIG. 5 is a sectional view showing a conventional GTO.

FIG. 4 is a view showing the relationship between the quantity of projection of the silicon substrate 14 and the leak current in the case where the silicon substrate 14 is projected from the anode and cathode thermal compensation plates 12 and 13 because the diameter of the silicon substrate 14 is made larger than the respective diameters of the thermal compensation plates 12 and 13. As apparent from the drawing, the leak current corresponding to the quantity of projection of a silicon substrate having crystal orientation of <1,0,0> is smaller than that in the case of another silicon substrate having crystal orientation of <1,1,1>. Further, although the leak current in the silicon substrate having crystal orientation of <1,1,1> suddenly increases with the increase of the quantity of projection, the leak current hardly changes in the case of using the silicon substrate 14 having crystal orientation of <1,0,0>. In the latter, therefore, the quantity of projection can be made to be 2 mm or more so that this is remarkably advantageous to cope with the scattering of the relative position between the silicon substrate 14 and the thermal compensation plates 12 and 13 in the producing process, resulting in improvement of the yield.

Although the crystal orientation of the main faces of the silicon substrate is made to be <1,0,0> ±2° in this embodiment, the same effects of the present invention can be obtained even in the case where the crystal orientation of the main faces of the silicon substrate is selected to be within a range of <1,0,0> ±27.5°.

According to the invention defined in aspects 1 and 2, in a compression-type semiconductor device using a silicon substrate, by making the crystal orientation of main faces of a silicon substrate to be <1,0,0>, the leak current is remarkably lowered upon application of a high voltage and the blocking voltage yield is greatly improved.

According to the invention defined in aspect 3, the time for heat treatment is reduced. Accordingly, the producing term is shortened so that the cost is reduced and the heavy metal contamination resulting from heat treatment jigs is reduced to suppress generation of the internal crystal defects in the silicon substrate due to the heavy metal contamination. Accordingly, the leak current is lowered upon application of a high voltage and therefore the blocking voltage yield is further improved.

According to the invention defined in aspect 4, the quantity of projection is made to be 2 mm or more, so that the scattering of the relative position between the silicon substrate and the thermal compensation plates in the producing process can be coped with so remarkably advantageously that the yield is improved.

According to the invention defined in aspect 5, each of the junctions between the cathode thermal compensation plate and the cathode electrode and between the anode thermal compensation plate and the anode electrode is made from a non-alloy material, so that the increase of the internal crystal defects of the silicon substrate due to the thermal strain can be suppressed. Accordingly, the leak current is reduced upon application of a high voltage and the blocking voltage yield is further improved.

What is claimed is:

1. A compression-type semiconductor device, comprising:
    a silicon substrate in which crystal orientation between main faces opposite to each other is within <1,0,0> ±27.5°;
    cathode and gate electrodes formed on one of said main faces of said silicon substrate;
    an anode electrode formed on the other of said main faces of said silicon substrate;
    a cathode thermal compensation plate for said cathode and gate electrodes; and
    an anode thermal compensation plate for said anode electrode.

2. The compression-type semiconductor device of claim 1, wherein said silicon substrate has a resistivity not smaller than 300 Ω.cm and comprises a bipolar region including an impurity-doped base layer and a non-doped region.

3. The compression-type semiconductor device of claim 2, wherein said base layer is formed by thermal diffusion of an impurity.

4. The compression-type semiconductor device of claim 2, wherein said silicon substrate is projected outside by 2 mm or more from a diameter of said cathode thermal compensation plate and/or said anode thermal compensation plate.

5. The compression-type semiconductor device of claim 2, wherein each of junctions between said cathode thermal compensation plate and said cathode electrode and between said anode thermal compensation plate and said anode electrode is made from a non-alloy material.

6. The compression-type semiconductor device of claim 2, wherein crystal orientation between main faces opposite to each other is <1,0,0> ±2°.

7. The compression-type semiconductor device of claim 1, wherein said silicon substrate is projected outside by 2 mm or more from a diameter of said cathode thermal compensation plate and/or said anode thermal compensation plate.

8. The compression-type semiconductor device of claim 1, wherein each of junctions between said cathode thermal compensation plate and said cathode electrode and between said anode thermal compensation plate and said anode electrode is made from a non-alloy material.

9. The compression-type semiconductor device of claim 1, wherein crystal orientation between main faces opposite to each other is <1,0,0> ±2°.

* * * * *